US006573516B2

(12) United States Patent
Kawakami

(10) Patent No.: US 6,573,516 B2
(45) Date of Patent: *Jun. 3, 2003

(54) ELECTRON-BEAM LITHOGRAPHY METHOD AND ELECTRON-BEAM LITHOGRAPHY SYSTEM

(75) Inventor: Kenichi Kawakami, Tokyo (JP)

(73) Assignee: Advantest Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/422,871

(22) Filed: Oct. 21, 1999

(65) Prior Publication Data

US 2002/0096645 A1 Jul. 25, 2002

(30) Foreign Application Priority Data

Oct. 23, 1998 (JP) .............................. 10-302605

(51) Int. Cl.[7] .............................. H01J 37/08; G01J 1/00
(52) U.S. Cl. .............................. 250/492.21; 250/492.22; 250/491.1; 250/492.24
(58) Field of Search ................ 250/492.21, 310, 250/491.1, 311, 492.22, 492.24

(56) References Cited

U.S. PATENT DOCUMENTS 3,900,737 A * 8/1975 Collier et al. ............ 250/492 A
5,315,123 A * 5/1994 Itoh et al. ................. 250/491.1
5,831,273 A * 11/1998 Someda et al. .......... 250/491.1
5,892,237 A * 4/1999 Kawakami et al. ....... 250/491.1

FOREIGN PATENT DOCUMENTS

| JP | 58-54632 | 3/1983 |
| JP | 61-10236 | 1/1986 |
| JP | 5-82426 | 4/1993 |

* cited by examiner

Primary Examiner—John R. Lee
Assistant Examiner—Kalimah Fernandez
(74) Attorney, Agent, or Firm—Christie, Parker & Hale, LLP

(57) ABSTRACT

Disclosed are an electron-beam lithography method and system having precision in exposure improved by correcting a beam drift even within the same column of chips, and an electron-beam lithography system having the frequency of correcting a beam drift minimized without causing degradation of precision. In the electron-beam lithography method and electron-beam lithography system, a beam drift is measured frequently. When a beam drift is measured during exposure of each column of chips, a positional deviation is not corrected at the time but is corrected, step by step, while a plurality of stripes is defined. It is thus prevented that a misalignment between adjoining stripes gets larger. Moreover, a beam drift is measured a plurality of times in order to measure a variation in beam drift. If a beam drift is small, a measurement interval is extended. If a beam drift is large, the measurement interval is shortened.

15 Claims, 10 Drawing Sheets

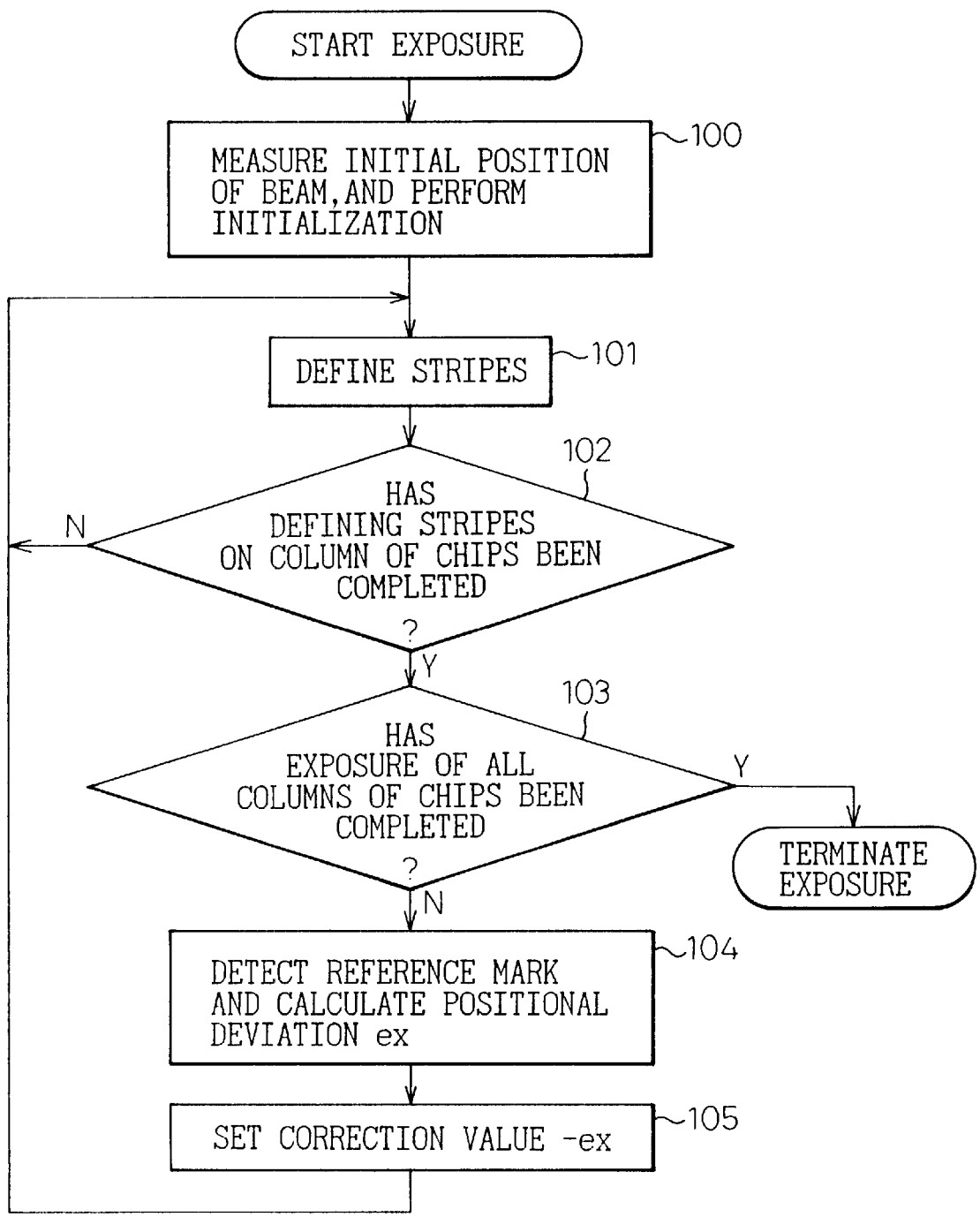

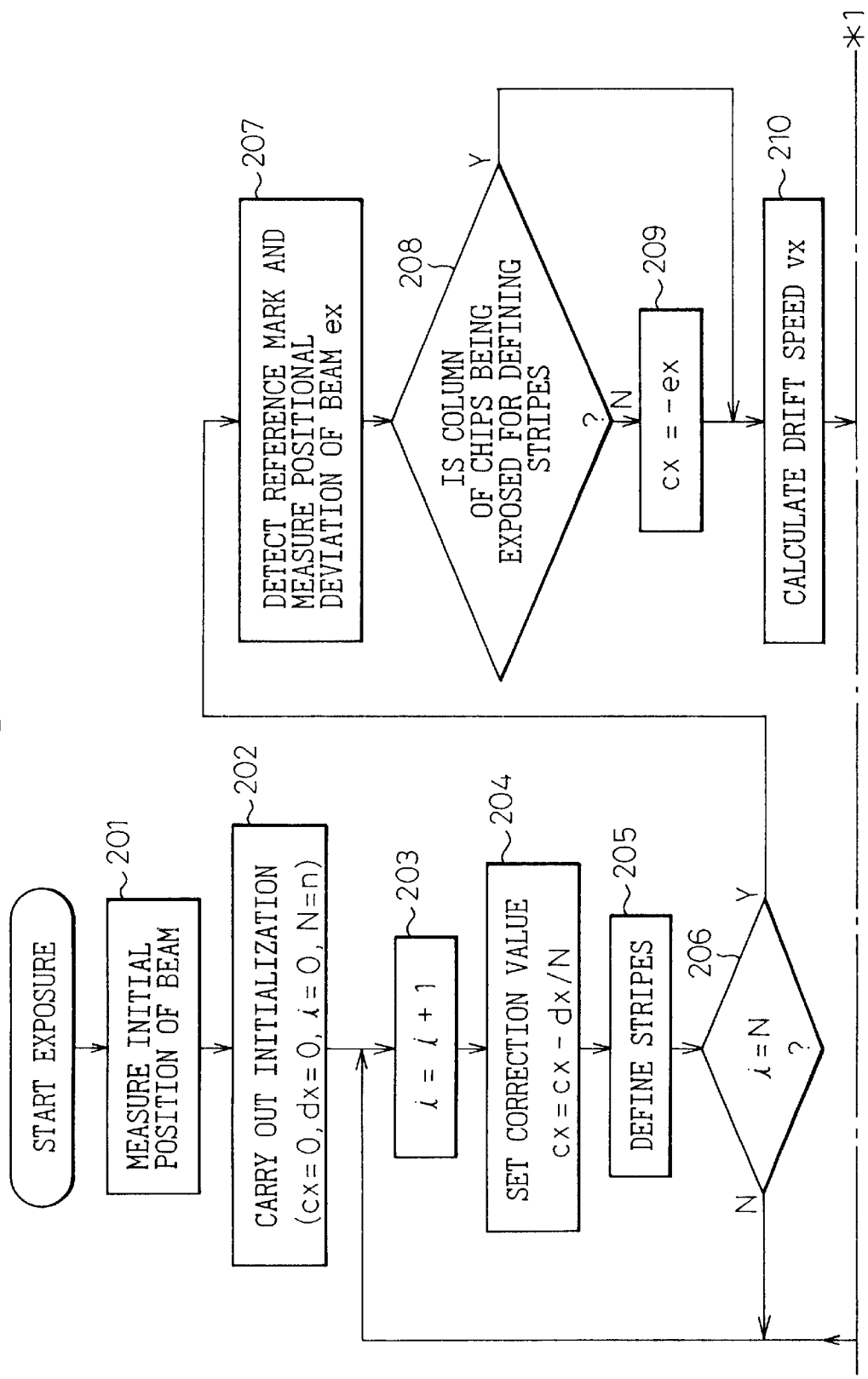

ELECTRON-BEAM LITHOGRAPHY METHOD AND ELECTRON-BEAM LITHOGRAPHY SYSTEM

BACKGROUND OF THE INVENTION

1. Field of the Invention

The present invention relates to an electron-beam lithography system, or more particularly, to an electron-beam lithography system for drawing patterns using an electron beam by continuously moving a stage.

2. Description of the Related Art

With advancement in a microprocessing technology, the trend of semiconductor integrated circuits is toward very dense integrated circuits. The performance which the microprocessing technology is required to offer must be severely evaluated. Among lithography technologies, the photolithography technology implemented in a step-and-repeat photolithography system with demagnification or the like in the past is expected to reach its limits in the near future. An electron-beam lithography technology is expected to take over from photolithography technology and be used for a new generation of microprocessing.

The drawbacks of the electron-beam lithography technology, been pointed out in the past, are low processing speed and poor manufacturing efficiency. For conventional electron-beam lithography systems, similarly to the step-and-repeat photolithography system with demagnification, a step-and-repeat photolithography method with demagnification has been adopted. According to this method, a sample (wafer) is placed on a stage. After a predetermined area is exposed and thus patterned, the stage is moved in order to expose a subsequent area for patterning. This procedure is repeated, whereby the whole sample is exposed and thus patterned. For example, one wafer is exposed to produce 60 chips each having a width of 15 mm. In this case, since an area in which an electron beam can be deflected is approximately 1.5 mm in width, the stage must be moved 100 times in order to produce each chip. For a whole wafer, the stage must be moved 6000 times. Exposure cannot be carried out while the stage is moved or until an irradiated position to which an electron beam is irradiated and which is changed with movement of the stage is determined accurately. This time interval shall be referred to as a stage settlement wait time herein. Movements of the stage are mechanical. For precise movement, therefore, it takes some time. The stage settlement time is therefore considerably long, or at present, about 0.5 sec. The time required for moving the stage 6000 times is as much as 50 min. There is therefore a difficulty in improving the processing speed.

Development of various technologies is under way in efforts to improve a throughput. A continuous movement lithography (stage scan) method is one example of these technologies. According to this method, the stage is moved continuously for exposure. FIG. 1A and FIG. 1B are explanatory diagrams concerning the continuous movement lithography method. FIG. 1A is concerned with a method of exposing a wafer with the stage being moved in one direction, while FIG. 1B is concerned with a method of exposing the wafer with the stage being advanced and returned in opposite directions.

As illustrated, a plurality of chips 90 is produced from a sample (wafer) 18. Only four chips are shown in the drawings. Normally, several tens to several hundreds of chips are produced. As mentioned above, an area in which an electron beam can be deflected is smaller than each chip 90. Each chip 90 is therefore segmented into a plurality of areas 91 and then exposed. According to the step-and-repeat photolithography method with demagnification, when the stage is moved to the center of each area, the area is exposed. In contrast, according to the continuous movement lithography method, as illustrated, the areas 91 that are aligned on the same column in the same column of chips 90 are exposed by moving the stage. In other words, an exposed area is segmented into a plurality of rectangular areas extending over the borders among chips. The stage is moved continuously over the rectangular areas. According to this method, the stage settlement wait time can be nullified and the processing speed can be improved. For example, assuming that the area in which an electron beam can be deflected is approximately 1.5 mm wide, an area having dimensions of 1.5 mm×ten several centimeters can be patterned during a single scan without the necessity of taking a stage settlement wait time. The total stage settlement wait time is therefore decreased to about 1/100. The processing speed therefore improves greatly. For methods of scanning a wafer with an electron beam to pattern it, the continuous movement lithography method can be said to be an essential technology. According to the continuous movement lithography method, a sample moves during patterning. The position of an electron beam must therefore be corrected accordingly. Controlling the position of an electron beam is therefore more complex than that according to the step-and-repeat photolithography method with demagnification. The continuous movement lithography method falls into the method of exposing a wafer with a stage being moved in one direction as shown in FIG. 1A, and the method of exposing a wafer with the stage being advanced and returned in opposite directions as shown in FIG. 1B. The method shown in FIG. 1B offers a higher processing speed because it is unnecessary to return to one extreme end. However, since backlash and the like pose a problem, a high-precision moving mechanism is needed.

FIG. 2 shows the configuration of an electron-beam lithography system for performing lithography according to the continuous movement lithography method. In FIG. 2, there are shown a processor 1, a magnetic disk 2, and a magnetic tape drive 3. These units are interconnected over a bus 4, and connected to a data memory 6 and stage control circuit 7 via an interface circuit 5 over the bus 4.

A housing (column) 8 accommodates an electron gun 9, a lens 10, a blanking electrode 11, a lens 12, a feedback coil 13, a sub-deflector coil 14, a lens 15, a main deflector coil 16, a stage 17, and a sample 18. The sample (wafer) 18 is placed on the stage 17. The stage 17 is moved in the X and Y directions according to an output signal of the stage control circuit 7.

Moreover, data read from the data memory 6 is supplied to a pattern correction circuit 20 via a pattern generation circuit 19. The pattern correction circuit 20 applies a blanking signal to the blanking electrode 11 via an amplifier 21. Moreover, the pattern correction circuit 20 applies a signal to the coils 13, 14, and 16 via D/A converters (DAC) 22, 24, and 26 and amplifiers 23, 25, and 27.

An electron beam radiated from the electron gun 9 passes through the lens 10. The electron beam is then transmitted or intercepted by the blanking electrode 11, and reshaped into a rectangular beam of parallel rays having any spot size of, for example, 3 μm or less. Thereafter, the feedback coil 13, sub-deflector coil 14, and main deflector coil 16 deflect the electron beam. The electron beam is then converged on the surface of the sample through the projection lens 15. Areas where the feedback coil 13, sub-deflector coil 14, and main deflector coil 16 can deflect the beam get larger in that order. Specifically, the area where the feedback coil 13 can deflect the beam is smaller than that where the sub-deflector coil 14 can. The area where the sub-deflector coil 14 can deflect the beam is smaller than that where the main deflector coil 16 can. For ensuring a large area where the beam can be deflected, the number of windings of a coil must be increased accordingly. The response speeds of the coils get lower in reverse order. In other words, a settlement wait time required by the feedback coil 13 is the shortest. Settlement wait times required by the sub-deflector coil 14 and main deflector coil 16 get longer in that order. In the foregoing configuration, the exposed areas 91 shown in FIG. 1A and FIG. 1B correspond to the area where the main deflector coil 16 can deflect the beam.

Referring back to FIG. 1A and FIG. 1B, whichever of the method of exposing a wafer with a stage being moved in one direction and the method of exposing it with the stage being advanced and returned in opposite directions is adopted, a position detection mark is inscribed near each chip 90. The position detection mark is detected with an electron beam, whereby an exposed position is determined. For producing IC chips, patterning must be performed on several layers. The stage is positioned relative to the position detection mark, whereby patterns drawn on the layers are aligned with one another. In reality, before patterning is performed, the position detection mark near each chip is detected in order to calculate a positional deviation of the chip or a misalignment between chips. When each chip is exposed to define a stripe thereon, the positional deviation is corrected.

In the electron-beam lithography system, the resolution offered with an electron beam and the precision in positioning are so high that very fine patterns can be drawn. However, a phenomenon that an electron beam drifts to change its position takes place because members including deflectors are charged up and a chamber forming the column and optical members expands thermally. This becomes a factor degrading the precision of an irradiated position at which an electron beam is irradiated. For preventing the phenomenon, the members including deflectors are made of a material that is hardly charged up or structured not to be charged up readily. Moreover, materials exhibiting very small coefficients of thermal expansion are used, and other measures are taken. Consequently, a beam drift has become much smaller.

If the line width of patterns is not very thin, the influence of the beam drift does not pose a serious problem. However, when finer patterns must be drawn, the influence of the beam drift cannot be ignored. The position of a beam is therefore measured at regular intervals in order to calculate the magnitude of a positional deviation, that is, a drift. The position of the beam is corrected by the calculated magnitude, and exposure is then carried out.

FIG. 3 is an explanatory diagram concerning a conventional method of correcting a drift. FIG. 4 is a flowchart describing drift correction based on the conventional drift correcting method. As shown in FIG. 3, according to a related art, when each column of chips has been exposed for defining all stripes, a position detection mark is detected to calculate a positional deviation of one chip from another. Before it starting to exposure the next column of chips so as to define stripes, a correction value for canceling the positional deviation is re-set. A solid line indicates a beam drift, dots indicate measured points and measured beam drifts, and small circles indicate correction values. For correcting the beam drift as graphically shown in FIG. 3, as described in FIG. 4, an initial position of a beam is measured and initialization is carried out at step 100. Stripes are defined at step 101. It is judged at step 102 whether defining stripes on a column of chips has been completed. If it is not completed, control is returned to step 101 and stripes are defined on the next column of chips. If defining stripes on the column of chips has been completed, it is judged at step 103 whether defining stripes on all columns of chips has been completed. If it is completed, exposure is terminated. If not, a position detection mark (reference mark) is detected to calculate a beam drift (a positional deviation) ex at step 104. A correction value is set to −ex at step 105. Control is then returned to step 101.

As shown in FIG. 3 and FIG. 4, a beam drift has been corrected for each column of chips in the past. The reasons why this correction has been adopted will be described below.

Occurrence of a beam drift is uncertain and a beam drift is hard to predict. Beam drifts occurring when layers are exposed are not the same in magnitude. The beam drift occurring on each layer is measured as a deviation of an exposed position for the layer. What counts is the absolute value of a deviation of one layer from another or a misalignment between layers. The absolute value corresponds to a difference between a value pointed out with a small circle in FIG. 3 and an associated value on the solid line indicating the beam drift.

In contrast, if a beam drift occurs while the same chip on the same layer is exposed to define adjoining stripes wiring extending over the stripes has mismatched portions. FIG. 5A to FIG. 5C are explanatory diagrams concerning occurrence of a misalignment between stripes on the same layer within the same chip. If a beam drift varies as indicated with a solid line in FIG. 5A, and if correction values indicated with small circles are adopted, deviations of exposed positions for defining stripes a, b, and c are indicated as A, B, and C. The sum of the deviations corresponds to a deviation of the layer from an adjoining one. The stripes a and b have therefore, as shown in FIG. 5B, a misalignment P between them. Herein, a difference in beam drift between adjoining stripes shall be small enough. If the difference were large, exposure itself would not be able to be carried out.

When a deviation of an exposed position for stripe c is large, and before exposure is performed to define the next stripe d, a correction value is modified by E corresponding to C. A deviation of an exposed position for stripe d is, as shown in FIG. 5C, D. Since the deviation for stripe c is C, a difference in deviation between stripes c and d is C–D=Q. The difference thus increases abruptly. When a beam drift is measured in the course of exposing the same column of chips, if an exposed position is corrected by the measured beam drift, a misalignment between adjoining strips increases abruptly.

In general, a tolerance of a misalignment between layers is larger than that of a misalignment between adjoining stripes on the same layer within the same chip. In the related art, therefore, every time exposing a column of chips is completed, a position detection mark is detected and a beam drift is measured and corrected. While each column of chips is exposed, a beam drift is regarded not to vary but remain constant. As shown in FIG. 3, assume that adjoining stripes are concerned and belong to different columns of chips. In this case, even if the correction value is modified, since the stripes do not exist on the same chip, the tolerance of a misalignment between the stripes is set to the one between layers.

However, the area of a chip has increased along with the trend of ICs towards more complex structures. ICs whose chips must each be exposed for defining ten several stripes have made their debuts. It therefore takes much time to expose one column of chips for defining all stripes. A variation in beam drift occurring meanwhile is therefore so large as to exceed the tolerance of a misalignment between layers. This poses a problem. For solving the problem, it is necessary to measure and correct a beam drift during exposure of one column of chips. When the correction is carried out, the misalignment between adjoining stripes increases. The correction, therefore, cannot be carried out.

Moreover, before a beam drift gets too large, after every exposure is completed for defining each stripe, the beam drift may be measured and corrected. However, this leads to a decrease in throughput. For measuring a beam drift, for example, an alignment mark on a wafer is regarded as a reference mark, the reference mark is scanned with an electron beam, and reflected electrons are detected. A time required for the electron beam to cross the reference mark is thus measured. For measuring a beam drift, therefore, the stage must be moved so that an electron beam will be positioned at the reference mark. Exposure must therefore be suspended in order to move the stage. Consequently, the throughput of the system decreases. If the beam drift is measured and corrected before a variation in beam drive becomes very large, it means that the beam drift is measured frequently. This also leads to a decrease in throughput. As mentioned above, even if a beam drift is large in magnitude, when the frequency of correcting the beam drift is raised, an exposed position can be set precisely, though the throughput decreases. When the time interval between corrections is extended, if a beam drift gets larger, precision is degraded impermissibly. The frequency of correcting a beam drift and the throughput of the system, and the time interval between corrections and the precision have a relationship of trade-off.

SUMMARY OF THE INVENTION

The first object of the present invention is to make it possible to correct a beam drift even during exposure of the same column of chips so that the correction can be performed frequently. The second object of the present invention is to minimize the frequency of correcting a beam drift without causing intolerable degradation in precision.

FIG. 6A and FIG. 6B are explanatory diagrams concerning the principles of the present invention.

As shown in FIG. 6A, in an electron-beam lithography method and electron-beam lithography system according to the first aspect of the present invention, a beam drift is measured frequently. When a beam drift is measured during exposure of each column of chips, a positional deviation is not corrected at a time but corrected step by step while a plurality of stripes is defined. Consequently, it is prevented that a misalignment between adjoining strips increases.

Moreover, in an electron-beam lithography method and electron-beam lithography system according to the second aspect of the present invention, a variation in beam drift is measured from a plurality of measured beam drifts. As shown in FIG. 6B, when a beam drift is small, an interval between measurements is extended. As shown in FIG. 6C, when the beam drift is large, the interval between measurements is shortened.

The electron-beam lithography method in accordance with the present invention is a method of patterning a sample in units of a stripe using an electron beam. The electron-beam lithography method consists of a step of measuring a drift made by an electron beam by detecting a reference mark, and a step of correcting the drift. According to the first aspect of the present invention, at the step of correcting a drift included in the lithography method, a drift is corrected step by step while a plurality of strips is defined after the measurement of the drift. According to the second aspect of the present invention, the lithography method further includes a step of calculating a drift per unit time and a step of calculating a time elapsing until the next step of detecting a drift according to the drift per unit time. At the step of calculating the drift per unit time, the drift per unit time is calculated from an elapsed time between a plurality of steps of detecting a drift and a difference between measured drifts.

Moreover, the electron-beam lithography system in accordance with the present invention consists mainly of an electron gun, a deflecting means for deflecting an electron beam emitted from the electron gun while converging it on a sample, and a moving mechanism to be moved with the sample placed thereon. While the sample is moved using the moving mechanism, the sample is exposed to the electron beam in order to define stripes having a predetermined width. The sample is thus patterned. This procedure is repeated. The electron-beam lithography system further includes a drift detecting means for detecting a reference mark and measuring a drift made by the electron beam, and a drift correcting means for correcting a drift. According to the first aspect of the present invention, the drift correcting means corrects a drift step by step at the time of defining a plurality of stripes succeeding the time of measuring a drift. According to the second aspect of the present invention, the electron-beam lithography system further includes a means for calculating a drift per unit time and a means for calculating a time elapsing until the next measurement of a drift according the drift per unit time. The means for calculating the drift per unit time calculates the magnitude of a drift per unit time using an elapsed time necessary for the drift detecting means to measure a drift, and a difference between measured drifts.

The constituent features in accordance with the second aspect can be added to the electron-beam lithography method and system in accordance with the first aspect.

According to the first aspect of the present invention, as shown in FIG. 6A, a reference mark may be detected during patterning of chips, and a beam drift d1 may be measured. In this case, the beam drift d1 is corrected step by step at the subsequent times of defining a plurality of stripes (four stripes in the drawing) indicated with small triangles. It can therefore be prevented that a misalignment between adjoining stripes increases abruptly. Even during patterning of chips, a relatively large beam drift can be corrected.

According to the second aspect of the present invention, as shown in FIG. 6B, when a beam drift is small, the number of stripes to be defined until the next measurement of a beam drift is increased (to six in the drawing). As shown in FIG. 6C, when a beam drift is large, the number of stripes to be defined until the next measurement of a beam drift is decreased (to two in the drawing). Thus, an interval between measurements and corrections of a drift is shortened according to the magnitude of a beam drift. Even when a beam drift is large, precision can be ensured for an exposed position. When a beam drift is small, even if the frequency of measurement is decreased, precision can be ensured for an exposed position. Therefore, the interval between measurements is extended in order to prevent a decrease in throughput.

In a method according to both the first and second aspects of the present invention, at a step of correcting a drift, the number of stripes, N, to be defined until the next step of measuring a drift is calculated from a calculated time elapsing until the next step of measuring a drift and an exposure time required for defining each stripe. A difference between a drift predicted to be measured at the next step of measuring a drift and a current drift correction value is calculated as dx. The drift is then corrected in units of dx/N while N stripes are defined.

Furthermore, an upper limit ux is determined for a difference in correction value between stripes. If the calculated dx/N is equal to or larger than the upper limit ux, a misalignment between the stripes becomes large. It is therefore preferred that an alarm is made in this case. In response to the alarm, measurements may be taken. Alternatively, a position exposed when the alarm is made is stored for future review of whether the misalignment is permissible for the position.

A standard value ssx may be determined in advance for a difference in correction values between stripes. If the calculated dx/N is larger than or equal to the absolute value of the standard value ssx, dx/N is set to the standard value ssx. A correction value is modified by the standard value ssx for defining each stripe. After a predicted temporal variation in beam drift is canceled out, a value canceling out the temporal variation in beam drift may be adopted as a correction value.

According to the first aspect, when a drift is detected during exposure of the same column of chips, the drift is corrected in units of the aforesaid dx/N. When a drift is detected at the completion of exposure of the same column of chips, the drift should preferably be corrected at one time.

According to the second aspect, the time elapsing until a drift is measured and corrected next may be calculated as a measurement interval elapsing until the next step of measuring a drift tm=sw/vx. between successive detections of a drift. Herein, the standard value sx is determined in advance at the step of measuring a drift next. At the step of calculating the number of stripes, the measurement interval tm=sw/vx is calculated from the drift per unit time, vx, and the standard value of a drift, sx.

Preferably, an upper limit T should be determined for the time elapsing between the steps of measuring a drift. When the measurement interval tm exceeds the upper limit T, the upper limit T should preferably be adopted as the time elapsing until the next step of measuring a drive. According to the aforesaid method, when a variation in drift detected through two measurements is limited, measurement of a drift may be carried out for a long time. The variation may presumably increase thereafter. It is therefore not preferred that measurement of a drift is not carried out for a very long time. Adopting the constituent features of the present invention can prevent this incident.

BRIEF DESCRIPTION OF THE DRAWINGS

FIG. 4 is a flowchart describing beam drift correction in accordance with the related art;

FIGS. 8A and 8B are flowcharts describing correction of a beam drift in accordance with the embodiment.

DESCRIPTION OF THE PREFERRED EMBODIMENTS

Figure 1A:
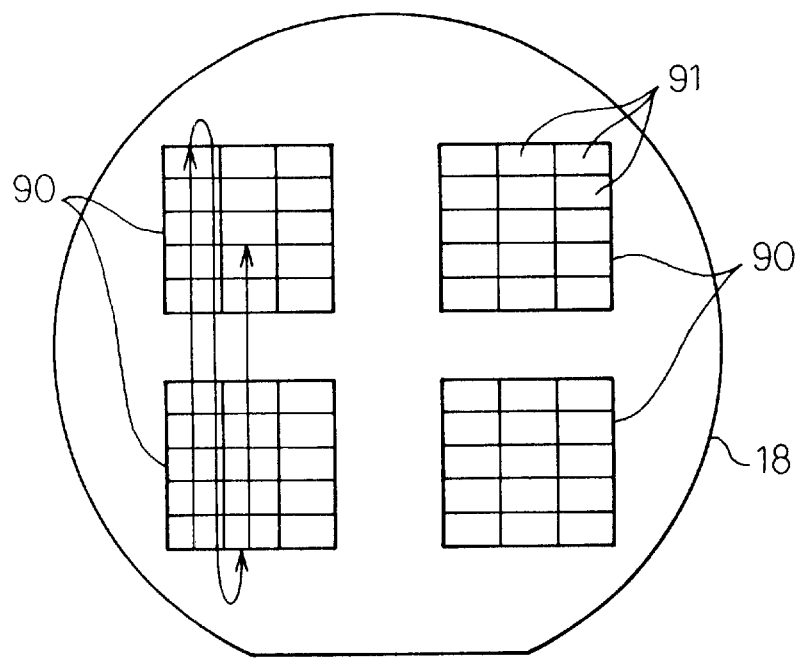
FIG. 1A and FIG. 1B are explanatory diagrams concerning a continuous movement lithography method implemented in an electron-beam lithography system.
Figure 1B:
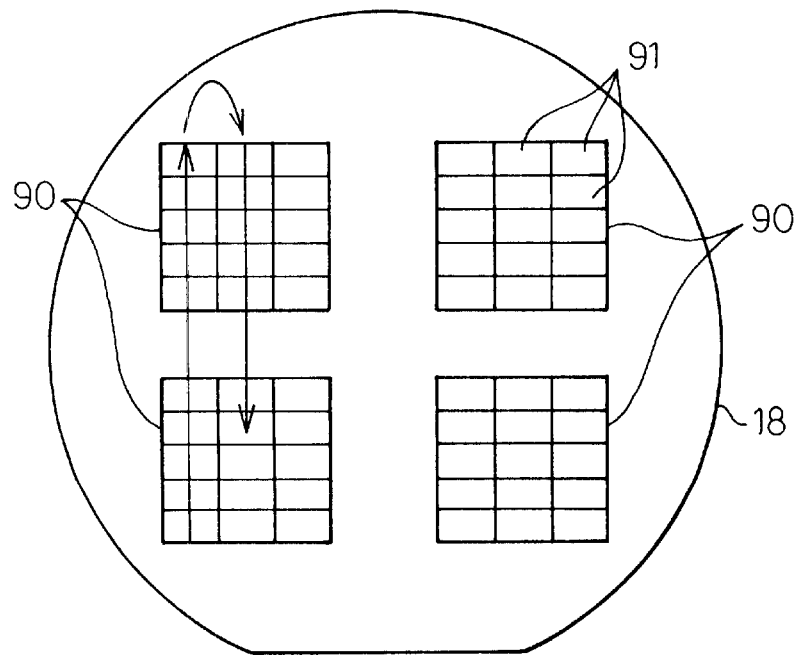
Figure 2:
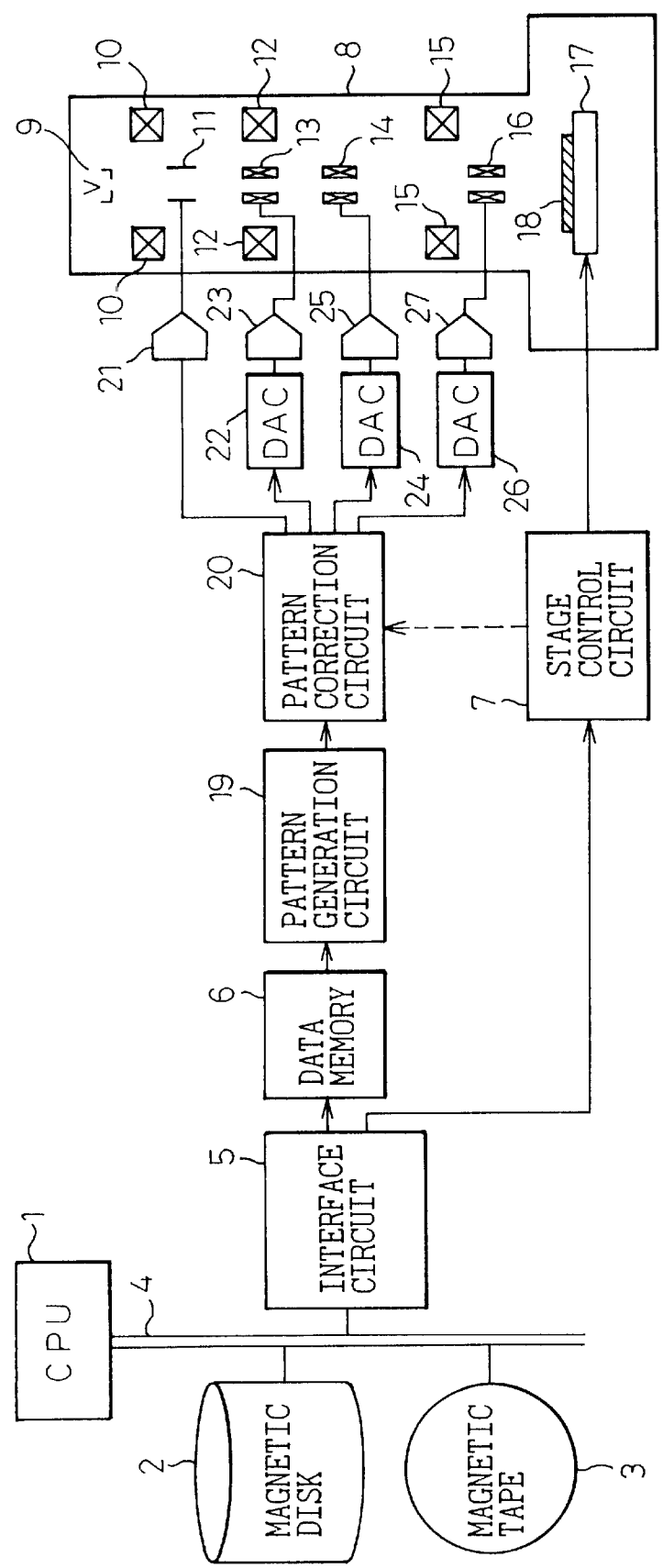
FIG. 2 shows the configuration of an example of electron-beam lithography systems.
Figure 3:
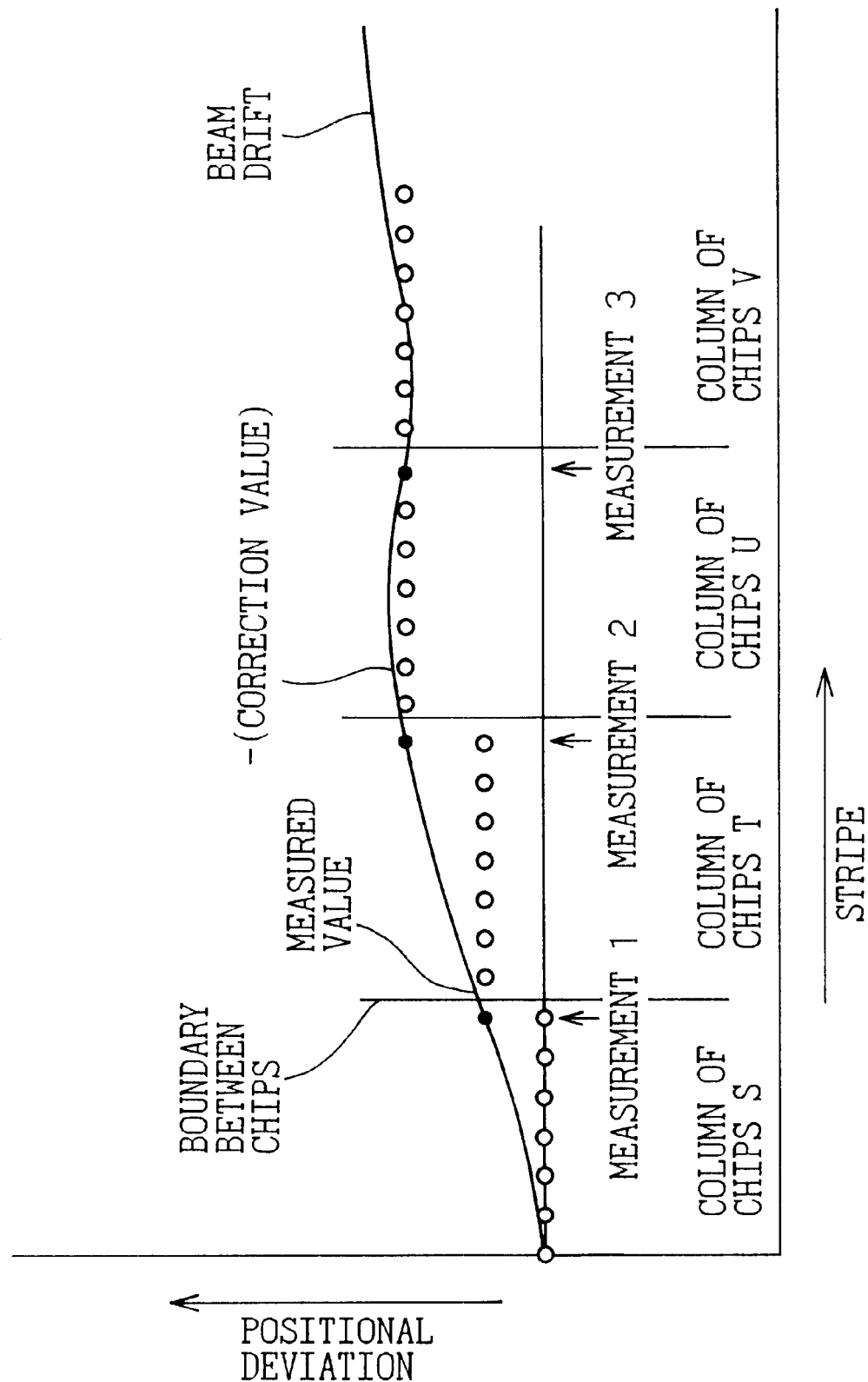
FIG. 3 is an explanatory diagram concerning correction of a beam drift in accordance with a related art.
Figure 5A:
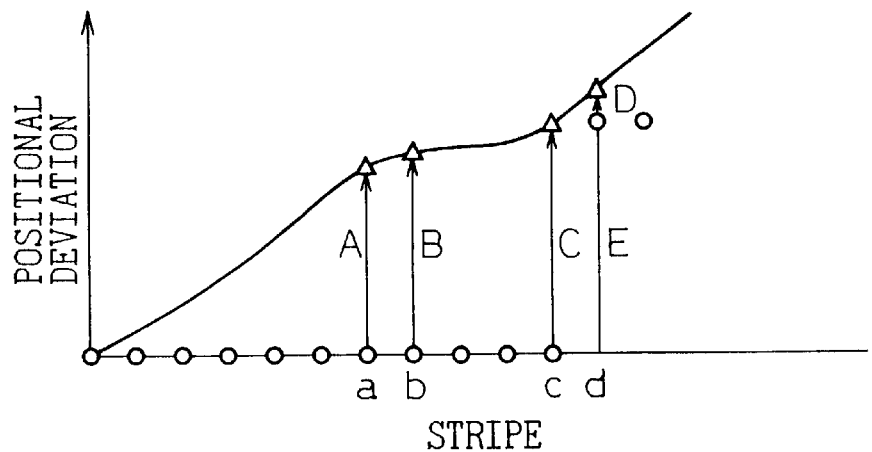
FIG. 5A to FIG. 5C are explanatory diagrams concerning deviations of exposed positions for adjoining stripes which correspond to beam drifts to be corrected in accordance with the related art.
Figure 5B:
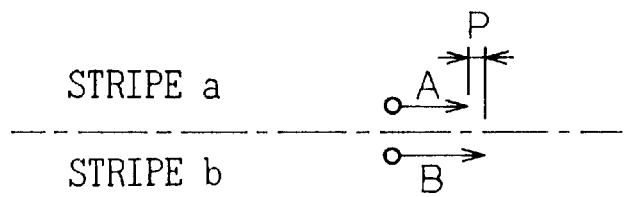
Figure 5C:
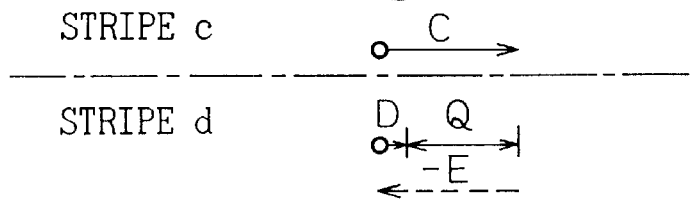
Figure 6A:
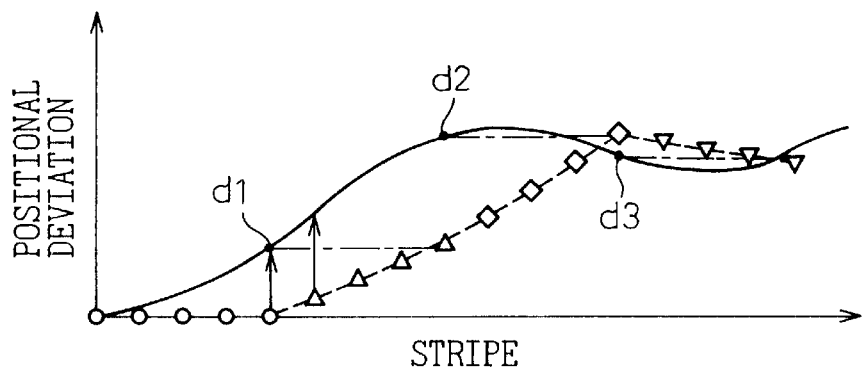
FIG. 6A to FIG. 6C are explanatory diagrams concerning correction of a beam drift in accordance with the present invention.
Figure 6B:
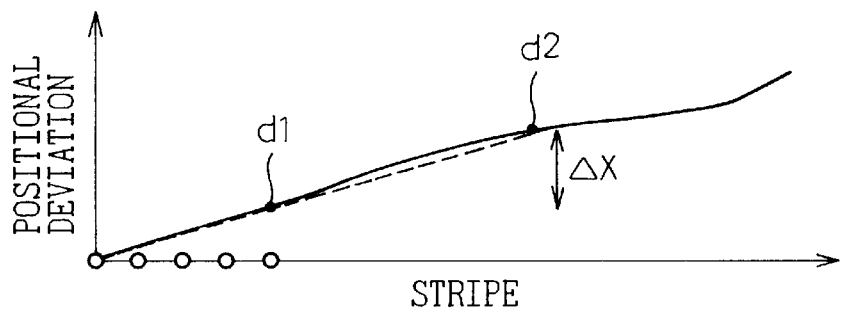
Figure 6C:
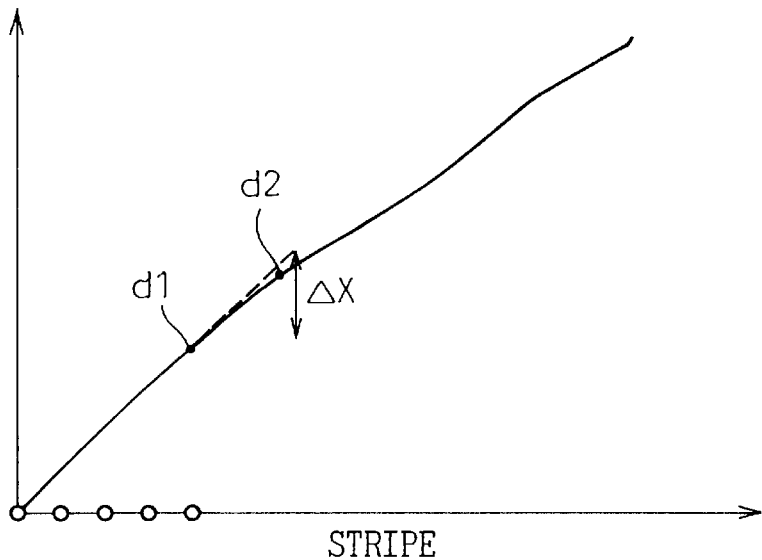
Figure 7:
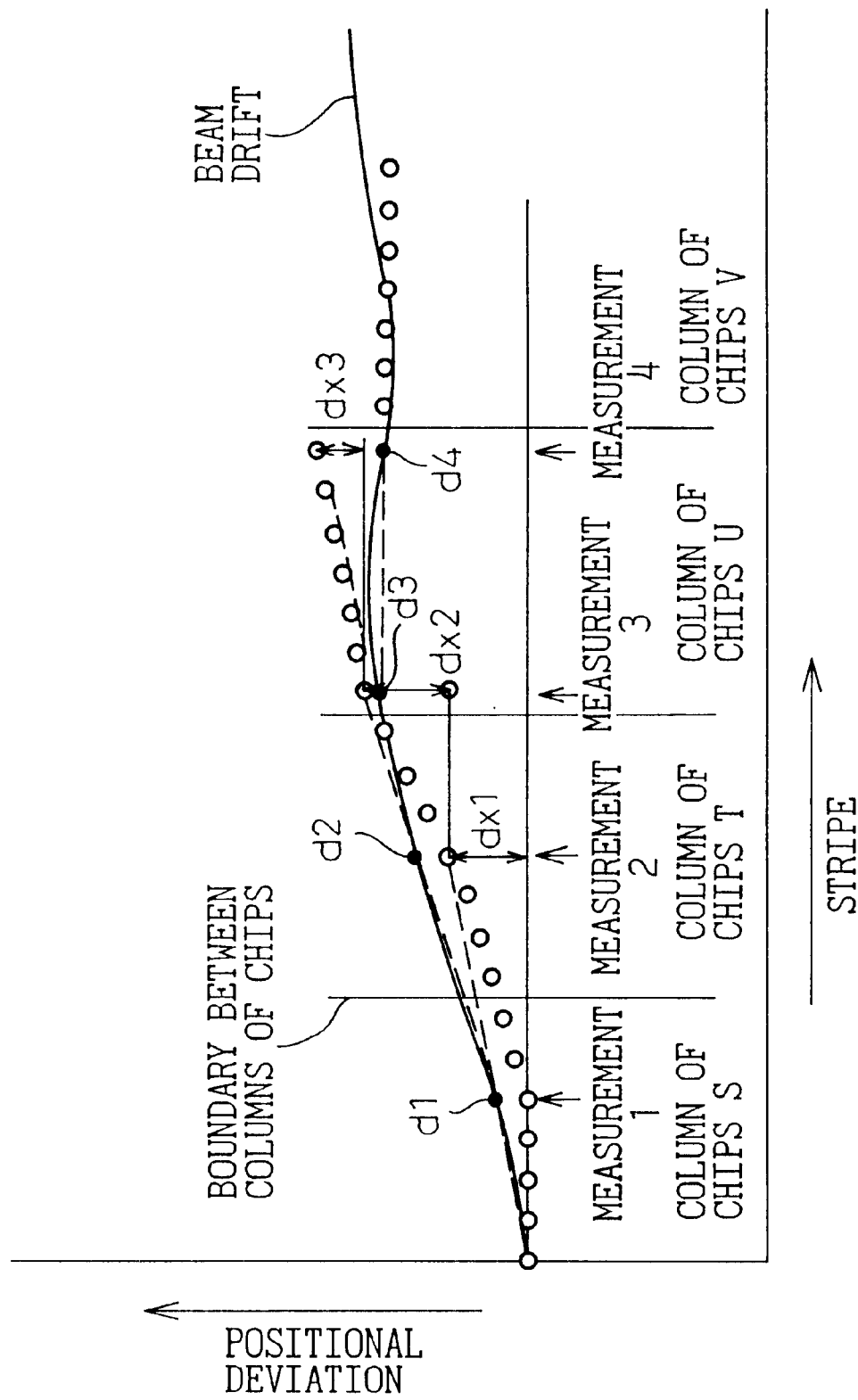
FIG. 7 is an explanatory diagram concerning correction of a beam drift in accordance with an embodiment.

FIG. 7 is an explanatory diagram concerning a drift correcting method in accordance with an embodiment of the present invention. An electron-beam lithography system of this embodiment has the configuration shown in FIG. 2, and carries out lithography according to the continuous movement method shown in FIG. 1A or FIG. 1B. A computer realized with the CPU 1 controls measurement and correction of a beam drift.

As shown in FIG. 7, each column of chips is exposed for defining seven stripes thereon. Before exposure of the first column of chips S is started, an electron beam is aligned. At the start of exposure, therefore, a beam drift is nil and a correction value is zero. In a predetermined time t0 after the start of exposure, when exposure of stripes is completed first (after four stripes are defined), measurement 1 is carried out for measuring a beam drift. The time t0 is set properly depending on a system. A beam drift detected at this time shall be beam drift d1. In other words, the beam drifts by d1 during the time t0 of measurement 1 since the start of exposure. An exposed position at that time is deviated by d1. A beam drift per unit time is therefore expressed as d1/t0.

In this embodiment, a beam drift is predicted to vary at the rate of d1/t0 after measurement 1. A standard value sx is determined for a deviation corresponding to a drift to be detected next. When the beam drift varies at the same rate, a time point at which the deviation is predicted to equal to the standard value sx is considered as the timing of measuring a beam drift next. As illustrated, when the column of chips is exposed to have six stripes defined thereon after measurement 1, the beam drift is predicted to equal to the standard value sx. Since a correction value is set to zero at the time of measurement 1, a time point when the beam drift is predicted to equal to the standard value sx is the timing of conducting measurement 2 for measuring the beam drift next. It is not preferable to measure the beam drift during exposure for defining stripes. Before the exposure for defining stripes is started or after it is completed, the beam drift is measured. Herein, the beam drift is measured after the exposure is completed. A deviation predicted to occur during measurement 2 shall be dx1.

The predicted deviation dx1 is corrected step by step at time instants, at which six stripes are defined, between measurement 1 and measurement 2. In other words, before exposure for defining the fifth stripe is started, a correction value for canceling out a beam drift is regarded as −dx1/6. The correction value is modified step by step, for example, the correction value is set to −dx1/3 for defining the next stripe. For measurement 2, the correction value is set to −dx1. Thus, the deviation is corrected step by step. The correction value will not vary very greatly between adjoining stripes. This leads to a small variation in deviation.

Similarly, the beam drift measured during measurement 2 is d2. The beam drift has varied by d2−d1 during a time interval t1 between measurement 1 and measurement 2. A beam drift per unit time is therefore expressed as (d2−d1)/t1. Assuming that the beam drift varies at this rate, when the column of chips is exposed for defining the fourth stripe, the deviation is predicted to equal to the standard value sx while being corrected with the correction value dx1. A time point when exposure for defining the fourth stripe is completed is regarded as the timing of conducting the next measurement 3. The correction value is modified so that a difference dx2 between a deviation predicted to occur during measurement 3 and the correction value dx1 set for measurement 2 will be canceled step by step during defining of four stripes.

The above measurements 1 to 3 are carried out during exposure of the columns of chips S, T, and U. However, measurement 4 is carried out at a time point when exposing the column of chips U is completed. A deviation occurring during measurement 4 (d4−dx1−dx2−dx3) is not corrected step by step but corrected at one time. This means that the correction value −d4 is canceled at a time. This is because after exposing a column of chips is completed, when the next column of chips is exposed, a misalignment between adjoining stripes does not pose a problem.

Referring to FIG. 7, beam drifts d3 and d4 to be measured during measurements 3 and 4 are approximately equal. A very long time elapses until the timing of conducting measurement 5 during which a deviation is predicted to equal to the standard value sx. Consequently, a measurement of beam drift will not be conducted for a long time. This means that beam drifts measured during two successive measurements have similar values but does not mean that a beam drift will not vary for a long time thereafter. It is not preferred that measurement of a beam drift is not conducted for a long time. An upper limit T is therefore determined for the time elapsing until the next measurement of a beam drift. When a calculated time elapsing until the next measurement of a beam drift exceeds the upper limit T, the upper limit T shall be regarded as the time elapsing until the next measurement of a beam drift.

Furthermore, not only the present embodiment but also a method of correcting a beam drift is preconditioned so that a beam drift will not vary abruptly. If a beam drift varies abruptly, it cannot be corrected. Even if the beam drift is corrected, a misalignment between adjoining stripes or layers is too large to be permissible. This leads to a defect. When a measured beam drift per unit time exceeds a predetermined upper limit, an alarm is made. For example, the alarm is alarm sound, an alarm lamp, or an alarm display.

Likewise, if a change in correction value between adjoining stripes, dxi/N (where i denotes a positive integer), is large, a misalignment between adjoining stripes may not be tolerable. Even when the change in a correction value between adjoining stripes dxn/N exceeds the upper limit, an alarm is made.

Figure 8B:
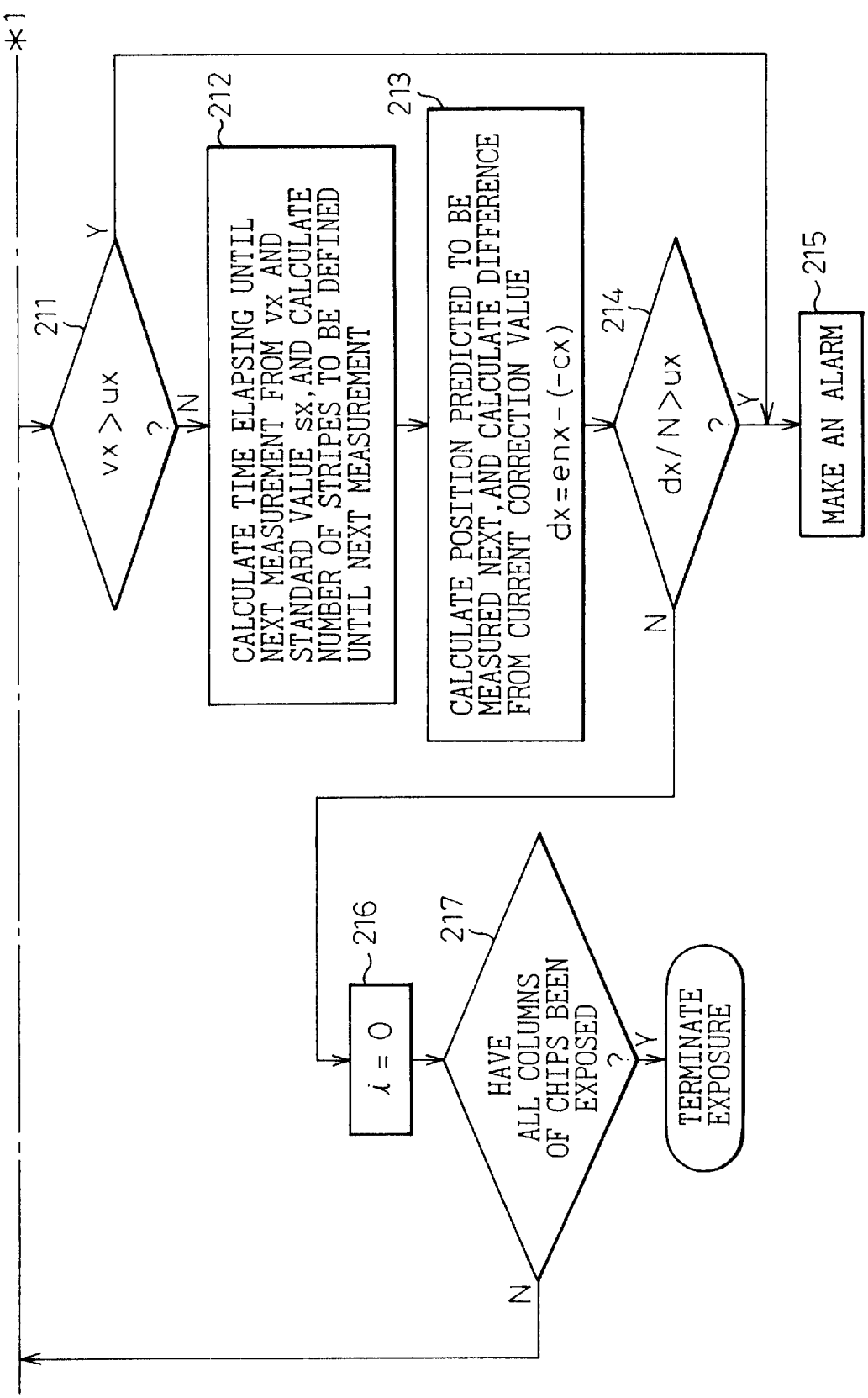

FIGS. 8A and 8B are flowcharts describing drift correction to be performed according to the method in accordance with the embodiment as shown in FIG. 7.

At step 201, the initial position of a beam is measured. At step 202, initialization is carried out. For initialization, variables cx, dx, and i are set to zeroes. A variable N is set to a predetermined value n. At step 203, i is incremented by one. At step 204, the correction value cx is modified by −dx/N. Since dx is initially set to zero, cx does not change. At step 205, stripes are defined. At step 206, it is judged whether i is equal to N (in this case, n). The steps 203 to 206 are repeated until i equals to N.

After the steps 203 to 206 are repeated n times, a reference mark is detected and a deviation of a beam from the reference mark (beam drift) ex is measured at step 207. At step 208, it is judged whether a column of chips is exposed for defining stripes. If stripes are being defined, control is passed to step 209. If stripes are not being defined or all stripes have been defined on columns of chips, the correction value cx is set to −ex. A deviation at that time is set to zero. Thereafter, control is passed to step 209.

At step 210, a drift speed vx is calculated from a difference between a previous measured beam drift and a current measured beam drift and an elapsed time between the previous and current measurements. At step 211, it is judged whether the drift speed vx exceeds the predetermined upper limit ux. If the drift speed vx exceeds the upper limit ux, control is passed to step 215 and an alarm is made. If vx does not exceed ux, control passes to step 212.

At step 212, a time until the next measurement is calculated from the drift speed vx and the standard value sx. The number of stripes N to be defined until the next measurement is determined. At step 213, a position enx where a beam drift is predicted to be measured is calculated. A difference dx from a correction value to be adopted for the measurement is calculated according to dx=enx−(−cx). Herein, when a beam drift is measured at the completion of exposure of columns of chips, if the correction value cx is set to −ex at step 209, dx indicates a variation in beam drift occurring until the next measurement.

At step 214, it is judged whether dx/N exceeds the predetermined value ux. If dx/N exceeds ux, control is passed to step 215 and an alarm is sounded. If dx/N does not exceed ux, the variable i is set to zero at step 216. It is judged at step 217 whether exposure is terminated. If there is still a column of chips to be exposed, control is returned to step 203. If there is no column of chips to be exposed, exposure is terminated.

Figure 9:
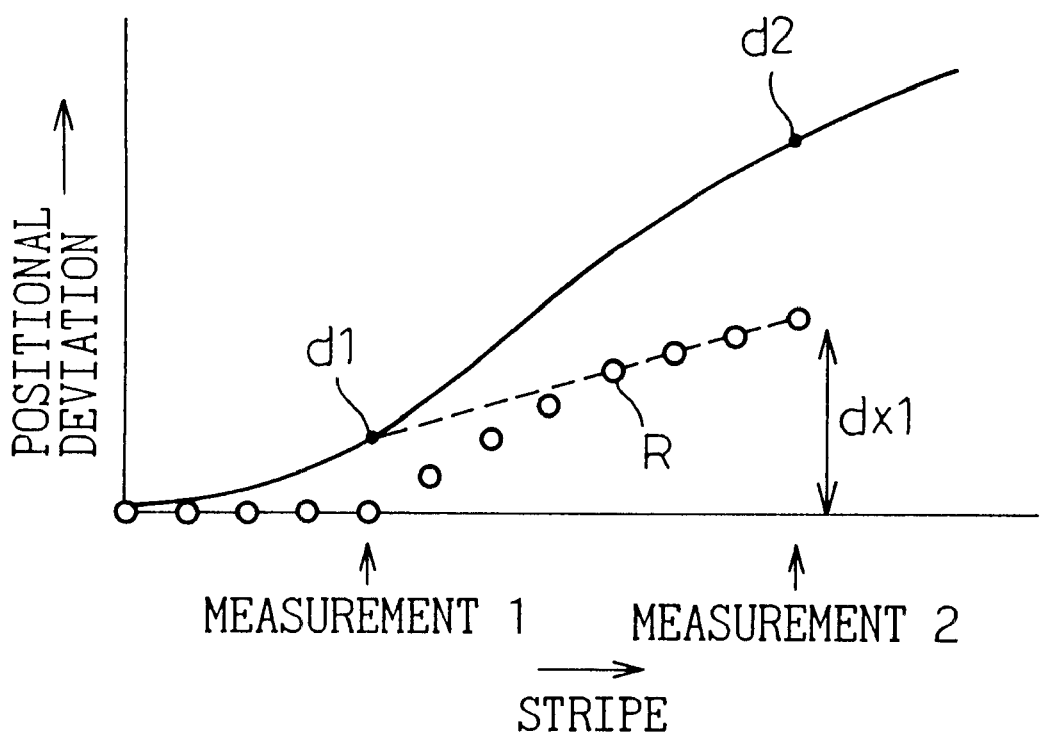
FIG. 9 is an explanatory diagram concerning another beam drift correction.

In the aforesaid embodiment, the difference dx between a predicted position at which a beam drift is predicted to be measured next and a correction value to be adopted for the measurement is corrected step by step or in units of the same magnitude while stripes are defined. Alternatively, another method to be described below may be adopted for correction. FIG. 9 is an explanatory diagram concerning the another correction method.

Based on a tolerable misalignment between adjoining stripes, an upper limit ssx is determined for a difference between correction values to be adopted for defining adjoining stripes. The beam drift measured during measurement 1 is d1. The timing of conducting the next measurement 2 is determined from a calculated beam drift per unit time and a standard value sx. The timing is the same as that in the aforesaid example. In the aforesaid example, the difference dx1 between a beam drift that is predicted to be measured during measurement 2 and a correction value adopted for the measurement 1 is divided by the number of stripes N (seven in this example) to be defined during a time interval between the measurements 1 and 2. Thus, the correction value dx1/N by which a beam drift is corrected for defining each stripe is calculated. By contrast, according to the another correction method, a beam drift is corrected by the upper limit ssx. Since the upper limit ssx is larger than dx1/N, after four stripes are defined, a deviation corresponding to a predicted beam drift is corrected perfectly. Thereafter, while three stripes are defined, a predicted beam drift alone is corrected step by step.

According to this correction method, a difference between correction values to be adopted for defining adjoining stripes is set to the upper limit ssx or less. Correction can be achieved more quickly so that a predicted deviation will be a nil soon.

As described so far, according to the present invention, a beam drift is not corrected very frequently. When a deviation of an exposed position becomes large within a tolerable range, a beam drift can be corrected even during exposure of the same column of chips. Furthermore, a beam drift can be measured and corrected according to the magnitude of the beam drift. Consequently, a deviation of an exposed position can be minimized without a great decrease in throughput.

What is claimed is:

1. An electron-beam lithography method for patterning a sample in units of a stripe using an electron beam, comprising:

detecting a reference mark and measuring a drift of said electron beam;

determining a correcting value corresponding to the measured drift;

dividing the correcting value into a plurality of sub-correcting values; and correcting the drift by making corrections equal to the sub-correcting values carried out in a plurality of stripe units which are defined after the drift is measured.

2. An electron-beam lithography method according to claim 1, further comprising calculating a drift per unit time from an elapsed time between said drift measurement and a previous drift measurement, and a difference between said measured drifts, and calculating a time elapsing until a subsequent drift measurement according to said drift per unit time.

3. An electron-beam lithography method according to claim 2, wherein during said correcting the drift, a number of stripe units, N, to be defined through exposure until the subsequent drift measurement is calculated from the calculated time elapsing until the subsequent drift measurement and an exposure time required for defining each stripe unit, and wherein a difference between a drill predicted to be measured at the subsequent drift measurement and a current drift correction value is calculated and regarded as dx, and wherein said plurality of sub-correcting values is calculated as dx/N, such that the drift is corrected in units of dx/N while each stripe unit, N, is defined.

4. An electron-beam lithography method according to claim 3, further comprising setting off an alarm when said calculated dx/N is equal to or larger than a predetermined upper limit, ux.

5. An electron-beam lithography method according to claim 3, wherein a standard value ssx is predetermined for a difference between correction values to be adopted for defining stripe units, wherein when the absolute value of said calculated dx/N is equal to or larger than said standard value ssx, said dx/N is set to said standard value ssx, and a correction value is modified by said standard value ssx every time each stripe unit is defined, and wherein, after said predicted drift is corrected, a correction value is set to cancel out a variation in drift.

6. An electron-beam lithography method according to claim 2, wherein when a drift measurement is carried out prior to completion of exposing a column of chips, a number of stripe units, N, to be defined until a subsequent drift measurement is calculated from said calculated time elapsing until the subsequent drift measurement and an exposure time required for defining each stripe unit, wherein a difference between a drift predicted to be measured at the subsequent drift measurement and a current drift is calculated and regarded as dx, and wherein said plurality of sub-correcting vales is calculated as dx/N, such that the drift is corrected in units of dx/N while each stripe unit, N, is defined, and wherein when a drift measurement is carried out at the completion of exposing a column of chips, the correcting value is equal to the measured drift and is corrected in one step, before exposing a next column of chips.

7. An electron-beam lithography method for patterning a sample in units of a stripe using an electron beam, comprising:

detecting a reference mark and measuring a drift of said electron beam;

correcting a drift;

calculating a drift per unit time from an elapsed time between said drift measurement and a previous drift measurement and a difference between said measured drifts; and calculating a time elapsing until a subsequent drift measurement according to said drift per unit time.

8. An electron-beam lithography method according to claim 2, wherein the time elapsing until the subsequent drift measurement is calculated as tm=sx/vx, wherein sx is a predetermined drift value.

9. An electron-beam lithography method according to claim 7, wherein the time elapsing until the subsequent drift measurement is calculated as tm=sx/vx, wherein sx is a predetermined drift value.

10. An electron-beam lithography method according to claim 8, wherein when said time elapsing until the subsequent drift measurement, tm, exceeds a predetermined upper limit T, tm is set to the upper limit T.

11. An electron-beam lithography method according to claim 9, wherein when said time elapsing until the subsequent drift measurement, tin, exceeds a predetermined upper limit T, tm is set to the upper limit T.

12. An electron-beam lithography method according to claim 2, wherein, when the calculated drift per unit time is equal to or larger than a predetermined upper limit for a drift per unit time, an alarm is activated.

13. An electron-beam lithography method according to claim 7, wherein, when the calculated drift per unit time is equal to or larger than a predetermined upper limit for a drift per unit time, an alarm is activated.

14. An electron-beam lithography system having an electron gun, a deflector for deflecting an electron beam emanating from said electron gun while converging it on a sample, and a moving mechanism to be moved with said sample mounted thereon, and repeating a procedure of exposing said sample for patterning in units of a stripe having a predetermined width while moving said sample using said moving mechanism, said electron-beam lithography system further comprising:

a drift measuring means for detecting a reference mark and measuring a drift of said electron beam; and a drift correcting means for correcting the drift, which divides a correcting value corresponding to the measured drift into a plurality of sub-correcting values, such that the drift is corrected by making corrections equal to the sub-correcting values, carried out in a plurality of stripe units, which are defined after the drift is measured.

15. An electron-beam lithography system having an electron gun, a deflector for deflecting an electron beam emanating from said electron gun while converging it on a sample, and a moving mechanism to be moved with said sample mounted thereon, and repeating a procedure of exposing said sample for patterning in units of a stripe having a predetermined width while moving said sample using said moving mechanism, said electron-beam lithography system comprising:

a drift measuring means for detecting a reference mark and measuring a drift of said electron beam; and a drift correcting means for correcting a drift, said electron-beam lithography system further comprising:

a means for calculating a drift per unit time from an elapsed time during which said drift is measured and a previous drift measurement, and said measured drifts; and a means for calculating a time elapsing until a subsequent drift measurement according to said drift per unit time.

* * * * *

UNITED STATES PATENT AND TRADEMARK OFFICE
CERTIFICATE OF CORRECTION

PATENT NO.    : 6,573,516 B2
DATED         : June 3, 2003
INVENTOR(S)   : Kawakami It is certified that error appears in the above-identified patent and that said Letters Patent is hereby corrected as shown below:

Title page,
Item [56], References Cited, U.S. PATENT DOCUMENTS, change "250/491.1" to -- 250/492.2 --.

Column 12,
Line 35, change "drill" to -- drift --.

Column 13,
Line 1, change "vales" to -- values --.
Line 37, change "tin" to -- tm --.

Signed and Sealed this

Twenty-fifth Day of October, 2005

JON W. DUDAS
*Director of the United States Patent and Trademark Office*